United States Patent
Kang

(12) United States Patent (10) Patent No.: US 6,771,555 B2
Kang (45) Date of Patent: Aug. 3, 2004

(54) ROW ACCESS INFORMATION TRANSFER DEVICE USING INTERNAL WIRING OF A MEMORY CELL ARRAY

(75) Inventor: Sang Hee Kang, Kyoungki-do (KR)

(73) Assignee: Hynix Semiconductor, Inc., Kyoungki-Do (KR)

(*) Notice: Subject to any disclaimer, the term of this patent is extended or adjusted under 35 U.S.C. 154(b) by 0 days.

(21) Appl. No.: 10/152,705

(22) Filed: May 22, 2002

(65) Prior Publication Data

US 2003/0107940 A1 Jun. 12, 2003

(30) Foreign Application Priority Data

Dec. 8, 2001 (KR) .......................................... 2001-77586

(51) Int. Cl.[7] ................................................ G11C 8/00
(52) U.S. Cl. .............................. 365/230.03; 365/230.06; 365/225.7
(58) Field of Search ...................... 365/200, 63, 225.7, 365/230.03, 230.06, 230.08

(56) References Cited

U.S. PATENT DOCUMENTS

| | | | | | |
|---|---|---|---|---|---|
| 5,287,310 A | * | 2/1994 | Schreck et al. | ........ | 365/189.05 |
| 5,446,692 A | * | 8/1995 | Haraguchi et al. | .......... | 365/200 |
| 5,532,966 A | * | 7/1996 | Poteet et al. | ................ | 365/200 |
| 5,590,085 A | * | 12/1996 | Yuh et al. | .................... | 365/200 |
| 5,608,678 A | * | 3/1997 | Lysinger | ...................... | 365/200 |
| 5,798,974 A | * | 8/1998 | Yamagata | .................... | 365/200 |
| 5,933,382 A | * | 8/1999 | Yi et al. | ..................... | 365/200 |
| 5,970,002 A | * | 10/1999 | Yoo | ........................... | 365/200 |
| 6,094,382 A | * | 7/2000 | Choi et al. | .................. | 365/200 |
| 6,144,593 A | * | 11/2000 | Cowles et al. | ............. | 365/200 |
| 6,498,756 B2 | * | 12/2002 | Lee | ............................ | 365/200 |

FOREIGN PATENT DOCUMENTS

| | | | |
|---|---|---|---|
| JP | 5-290598 | * | 11/1993 |
| JP | 6-012891 | * | 1/1994 |
| JP | 6-150690 | * | 5/1994 |
| JP | 6-259988 | * | 9/1994 |
| JP | 8-106796 | * | 4/1996 |
| JP | 9-213098 | * | 8/1997 |

* cited by examiner

Primary Examiner—Gene N. Auduong
(74) Attorney, Agent, or Firm—Marshall, Gerstein & Borun LLP

(57) ABSTRACT

Row access information transfer devices and methods are disclosed which use an internal wiring of a memory cell array to transfer information to a column fuse box array. The disclosed techniques and structures can increase the efficiency of a circuit by transferring sense amplifier and wordline control signals relating to a specific row block corresponding to an inputted row address to a column fuse box array using wiring within the cell array, when the row block is accessed in DRAM.

11 Claims, 9 Drawing Sheets

ROW ACCESS INFORMATION TRANSFER DEVICE USING INTERNAL WIRING OF A MEMORY CELL ARRAY

TECHNICAL FIELD

1. Field of the Invention

A dynamic random access memory (DRAM) device, and more particularly a row access information transfer device using internal wiring of a memory cell array to communicate instructions to a column fuse box array is disclosed.

2. Description of the Prior Art

FIG. 1 is a block diagram of a conventional row access information transfer device, which illustrates a hierarchical wordline mode. A row block decoder 60 and a column fuse box array 70 are positioned at an angle of 90 degrees. The row block decoder 60 produces a row block select signal and outputs to corresponding block control units (0 to M) within a row block control unit 10. Further, the row block decoder 60 serves to transfer a row block signal (accessed by a row address received from a row address predecoder 40 and a row redundancy signal from a row fuse 50) to the column fuse box array 70 when DRAM is activated. A column decoder 30 selects a specific column using a column address signal and a column redundancy signal from the column fuse box array 70.

The row address predecoder 40 decodes an inputted row address responsive to an active command from DRAM and outputs the decoded signal to a main wordline driver 11 and to the row block decoder 60. At this time, the logic state of a row redundancy signal inputted from a row fuse 50 determines whether a wordline corresponding to the inputted row address is repaired or not. Also, each of the block control units (0 to M) within the row control unit 10 activates a corresponding row block (0 to M) in response to the row block select signal from the row block decoder 60.

The block control units (0 to M) outputs the block select signal (msb) for controlling a wordline and a sense amplifier to a corresponding row block depending on the row block select signal received from the row block decoder 60.

According to, the conventional row access information transfer device, the row block decoder 60 transfers M row block signals to the column fuse box array 70. Therefore, the row block decoder 60 again encodes a row address (which had been pre-decoded in the row address predecoder 40) and the decoded row redundancy signal.

In DRAM, since a circuit corresponding to a row block decoder 60, a circuit corresponding to a column decoder 30 and various supply lines co-exist at a region where the row decoder and the column decoder intersect each other, the circuit construction and the wiring are very complicated. Moreover, the conventional row access information transfer device is disadvantageous in that it requires M additional bus lines to transfer M row block signals from in the row block decoder 60 to the column fuse box array 70. The efficiency of use area and wiring is degraded in the intersecting region of the row block decoder 60 and the column decoder 30.

SUMMARY OF THE DISCLOSURE

A row access information transfer device is provided which includes a memory cell array; and a row control unit for decoding a row address signal and a row redundancy signal and for outputting a block select signal for selecting a corresponding row block and a row block signal. The device also includes a column fuse box array responsive to the row block signal. A path for transferring the row block signal from the row control unit to the column fuse box array is at lest partially within the memory cell array.

BRIEF DESCRIPTION OF THE DRAWINGS

Throughout the following drawings and description, like reference numerals refer to like parts.

DETAILED DESCRIPTION OF PREFERRED EXAMPLES

Figure 1:
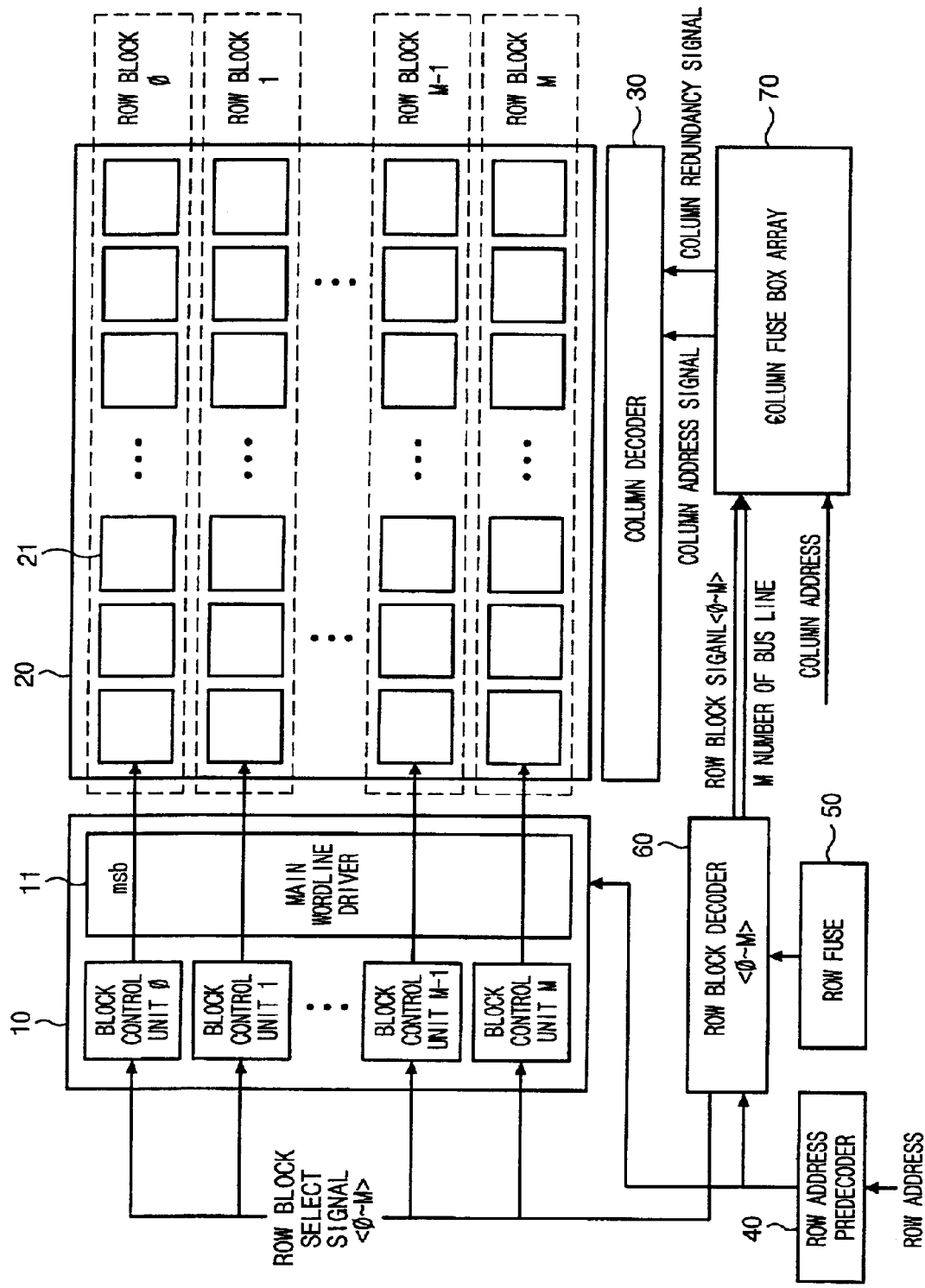
FIG. 1 is a block diagram of a conventional, prior art, row access information transfer device.
Figure 2:
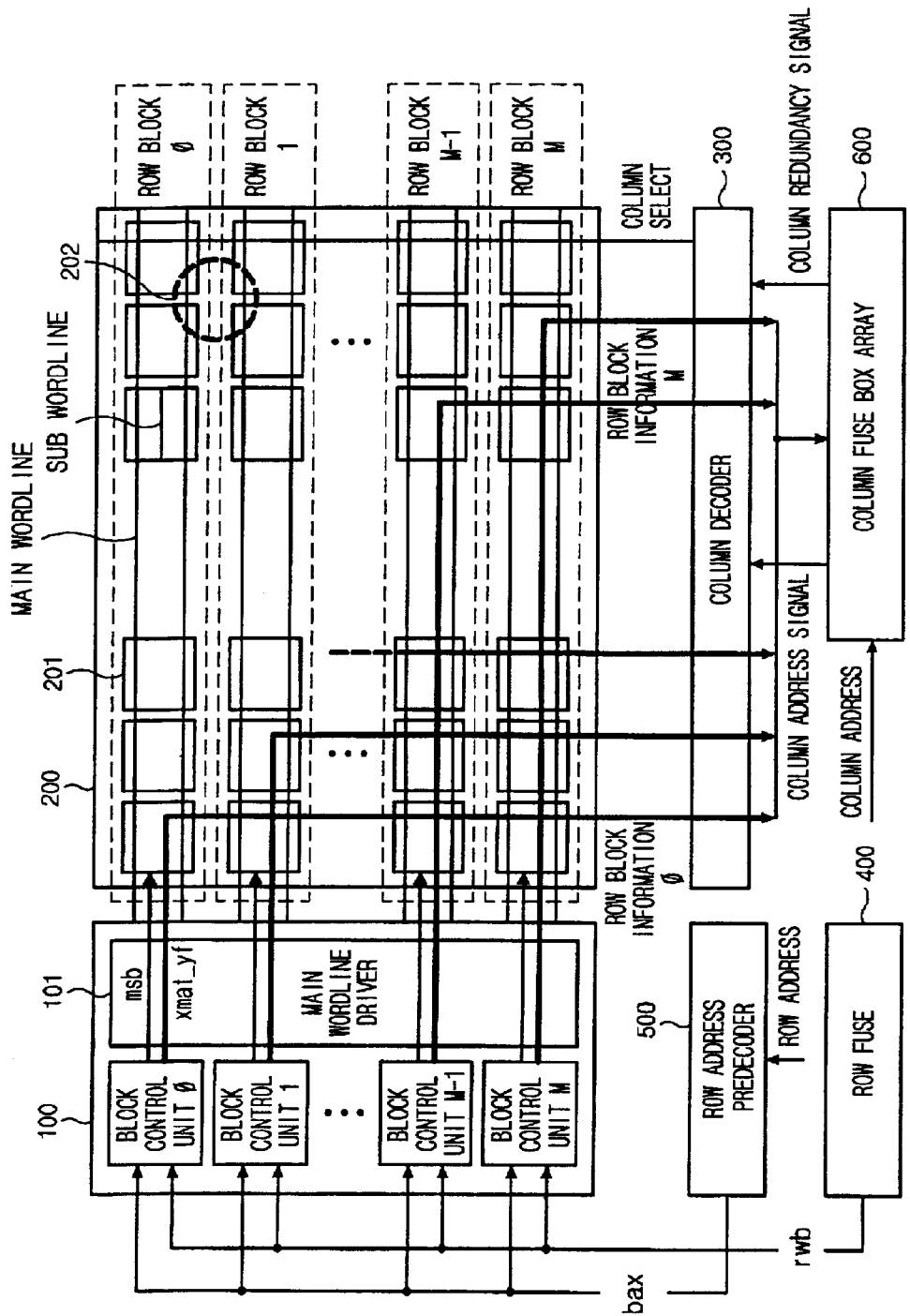
FIG. 2 is a block diagram of a row access information transfer device constructed in accordance with the teachings of the present invention.

FIG. 2 is a block diagram of an exemplary row access information transfer device using internal wiring of a memory cell array to transfer information to a column fuse box array. The row access information transfer device includes a row control unit 100, a memory cell array 200, a column decoder 300, a row fuse 400, a row address predecoder 500 and a column fuse box array 600.

The row control unit 100 includes a plurality of block control units (0 to M) and a main wordline driver 101. The memory cell array 200 includes row blocks (0 to M); each of which comprises a plurality of unit memory cell arrays 201. Each of the block control units (0 to M) receives a row address predecoding signal (bax) from the row address predecoder 500 and a row redundancy signal (rwb) from the row fuse 400. The column decoder 300 selects a specific column, based on an column address signal and a column redundancy signal from the column fuse box array 600. The column fuse box array 600 includes a fuse for programming a column address and a row block signal within a respective fuse box. The column fuse box array 600 employs information on the row block in order to operate a redundancy column.

In the case of a DRAM using a hierarchical wordline, the row block includes one main wordline and a plurality of sub wordlines. Each sub wordline is responsible for only a unit memory cell array 201. The number of sub wordlines connected to one main wordline is determined by the number of wordline-driving signals PX. At the present time, four or eight sub wordlines are usually used. When the main wordline and one of the four or eight wordline-driving signals PX are selected, one sub wordline is selected. This is called 1:4 decoding and 1:8 decoding between the main wordline and the sub wordline. In 1:8 decoding mode it is easy to interconnect a connection line of block information at the unit memory cell array.

The block control units (0 to M) in the row control unit 100 directly decode the row redundancy signal (rwb) and the row address predecoding signal (bax) when the DRAM is activated. The block control units (0 to M) produce a block select signal (msb) for selecting a corresponding row block when a specific row block is accessed. Also, the block control units(0 to M) generates a row block signal (xmat_yf) including informations of row block selection, which is transferred to the column fuse box array 600 through wiring within the memory cell array.

The row address predecoder 500 decodes the inputted row address when an active command is applied and outputs the row address predecoding signal (bax) to the block control units (0 to M). Whether or not a wordline corresponding to a row address input to the block control units (0 to M) is repaired is dependent upon the row redundancy signal (rwb) from the row fuse 400. Also, the block control unit (0 to M) within the row control unit 100 activates a row block corresponding to a predecoded address received from the row address predecoder 500.

The above disclosed approach can increase the wiring efficiency of a circuit, by transferring information on a specific row block corresponding to an inputted row address to the column fuse box, using the wiring within the cell array when accessing the row block.

Figure 3:
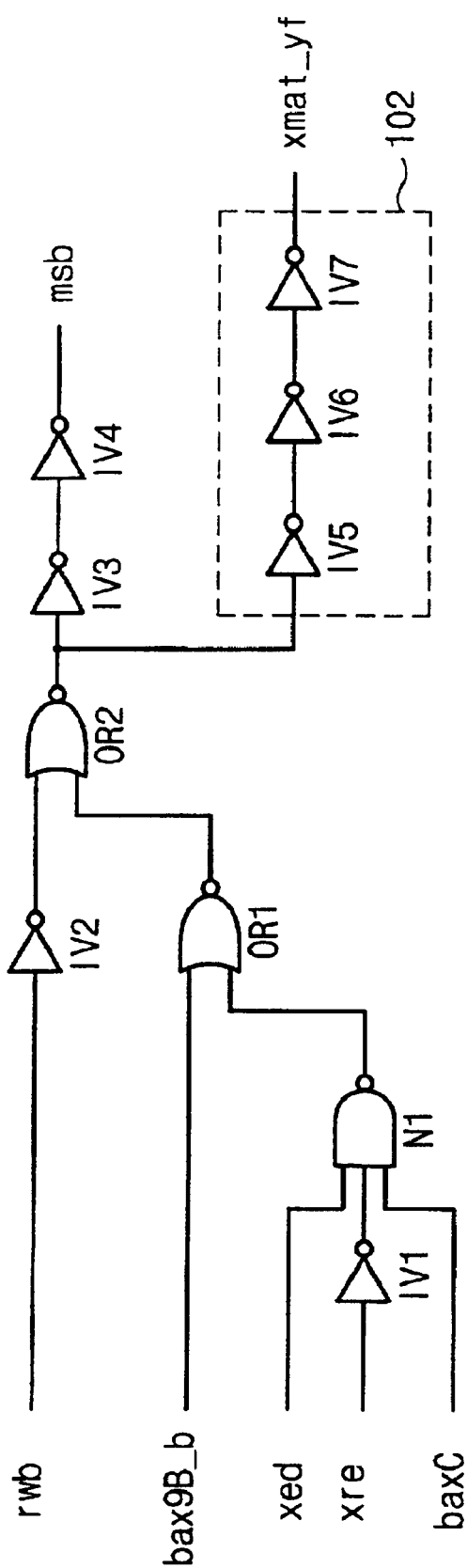
FIG. 3 is a detailed circuit diagram of a block control unit in FIG. 2.

FIG. 3 is a detailed circuit diagram of an exemplary block control unit used in the circuit of FIG. 2. The block control units (0 to M) receive wordline control signals (xed and xre) which are selectively activated depending on whether a redundancy comparison result of the inputted row address is a normal wordline or a redundant wordline. If it is a normal wordline, the wordline control signal xed becomes HIGH and the wordline control signal xre becomes LOW. On the other hand, if it is a redundant wordline, all the wordline control signals xed, xre become HIGH. Also, each of the block control units (0 to M) has a circuit for generating a row block signal depending on a part of the output of the row address predecoder 500 and the row redundancy signal (rwb) from the row fuse 400.

More specifically, each of the block control units (0 to M) includes an inverter IV1 for inverting the wordline control signal (xre). Each block control unit also includes a NAND gate N1 for performing a NAND logic function on the wordline control signal (xed), the wordline control signal (xre) (after being inverted by the inverter IV1) and address signal (baxC). Each block control unit also includes an OR gate OR1 for performing an OR logic function on the output of the NAND gate N1 and the row address predecoding signal (bax9B_b). Each block control unit also includes an inverter IV2 for inverting the row redundancy signal (rwb), an OR gate OR2 for performing an OR logic function on the row redundancy signal (rwb) and the output of the OR gate OR1, an inverter IV3 for inverting the output of the OR gate OR2, and an inverter IV4 for inverting the output of the inverter IV3 to produce a block select signal (msb). Each of the block control units (0 to M) includes a row block signal generating unit 102 for inverting/delaying the output of the OR gate OR2 to produce a row block signal (xmat_yf). The row block signal generating unit 102 includes an odd number of inverter (IV5 to IV7).

Each of the block control units (0 to M) selects a row block corresponding to the block select signal (msb). Each also transfers the row block information to the column fuse box array 600 via the wiring within the memory cell array 200 using the row block signal (xmat_yf) (which is an output signal of the row block signal generating unit 102).

As such, the disclosed apparatus can eliminate the conventional row block decoder and can reduce the layout area at a row/column intersecting region by generating a row block signal using the output of the row address predecoder 500 and the row redundancy signal directly from the block control units (0 to M) in the row control unit 100.

Figure 4:
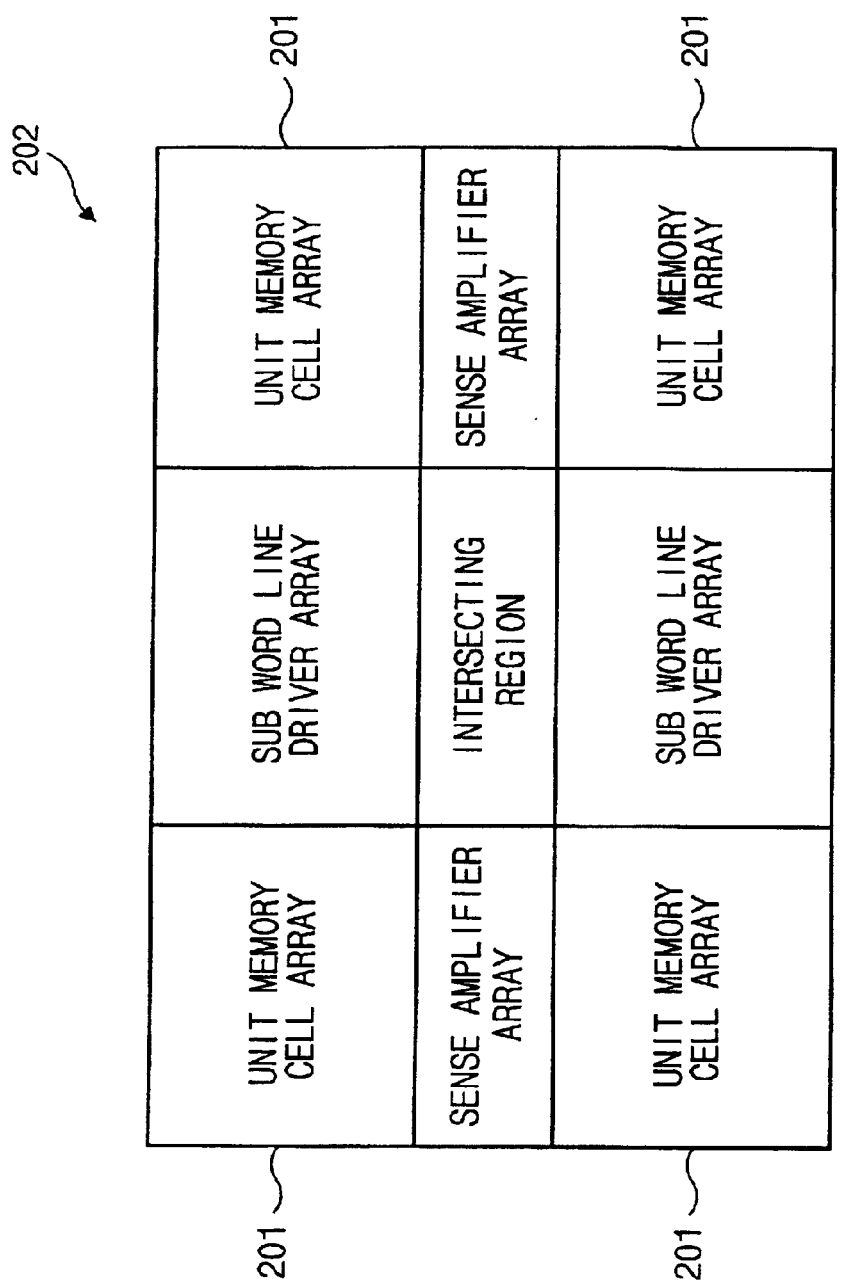
FIG. 4 illustrates an internal structure of the memory cell array in FIG. 2.

FIG. 4 illustrates an internal structure 202 of a portion (see FIG. 2) of an exemplary memory cell array 200 used in the circuit of FIG. 2. The internal structure of the memory cell array 200 includes a sub wordline driver array and a sense amplifier array between respective unit memory cell arrays 201. It also includes an intersecting region between the sense amplifier array and the sub wordline driver array.

The circuit of FIG. 2 transmits the row block signal (xmat_yf) outputted from the block control units (0 to M) to the column fuse box array 600 using the wiring in the unit memory cell array 201 (note the location of the heavy dark lines representing the data transfer path in FIG. 2).

A connection structure of a row block signal within the memory cell array 200 will be described below. The row block signals (0 to M) output from respective block control units (0 to M) are passed via a path in a horizontal direction through a region between the main wordlines. Also, they are transmitted via a path in a vertical direction (downward) through a column region or a sub wordline driver array region at a specific position. Also, the row block signals (0 to M) approach the column fuse box array 600 out of the memory cell array 200 and are then transmitted to the column fuse box array 600

Figure 5:
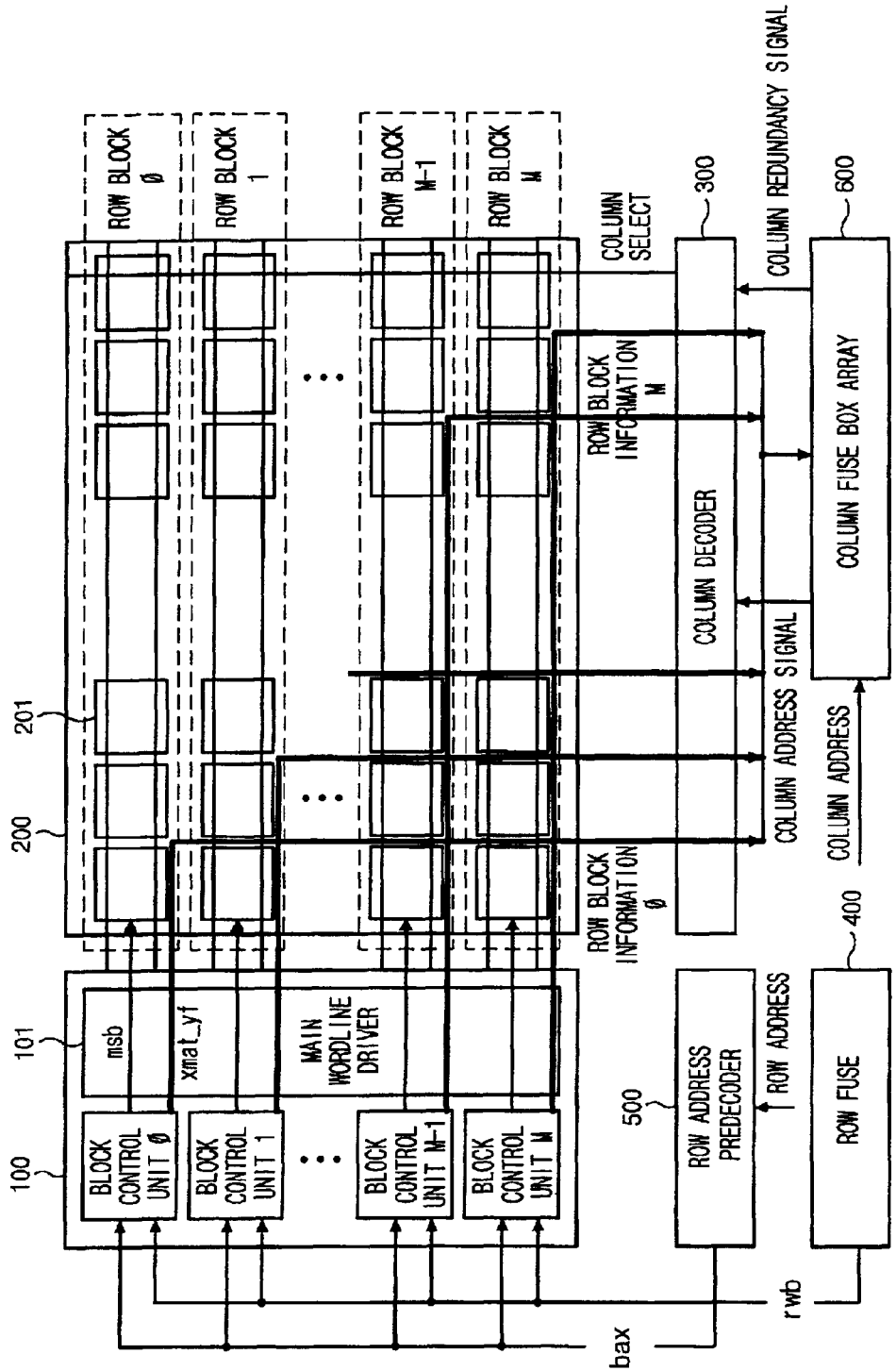
FIG. 5 illustrates another device constructed in accordance with the teachings of the present invention.

FIG. 5 is another example of a row access information transfer device using an internal wiring of a cell array. The construction of the circuit of FIG. 5 is identical to that of the circuit of FIG. 2 except for the wiring within the memory cell array 200. In the row access information transfer device of FIG. 5, if wiring between the main wordlines is impossible, the row block signal (xmat_yf) is passed via a path in a horizontal direction through the sense amplifier array region and is passed via a path in a vertical direction through the sub wordline driver array region at the intersection region (see FIG. 4), so that the row block signal (xmat_yf) from the block control unit (0 to M) is outputted to the column fuse box array 600.

FIGS. 6–9 are other examples of row access information transfer devices using internal wiring of a cell array to transfer information to the column fuse box array 600.

Figure 6:
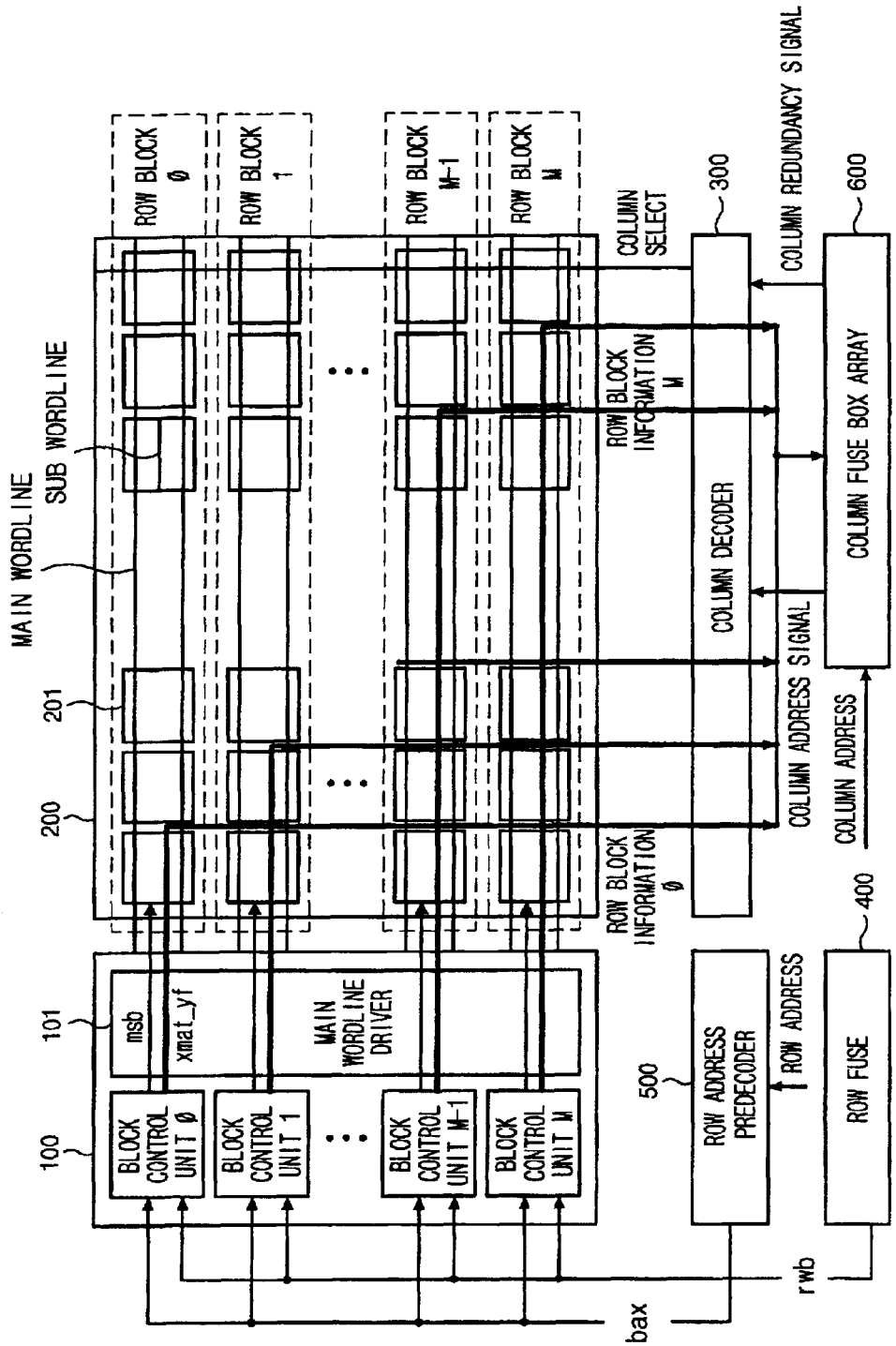
FIG. 6 illustrates another device constructed in accordance with the teachings of the present invention.

In the row access information transfer device of FIG. 6, a row block signal is transmitted via a path in a horizontal direction through the unit memory cell array 201 region and the sub wordline driver array region and is transmitted via a path in a vertical direction through the sub wordline driver array region, so that the row block signal is outputted to the column fuse box array 600.

Figure 7:
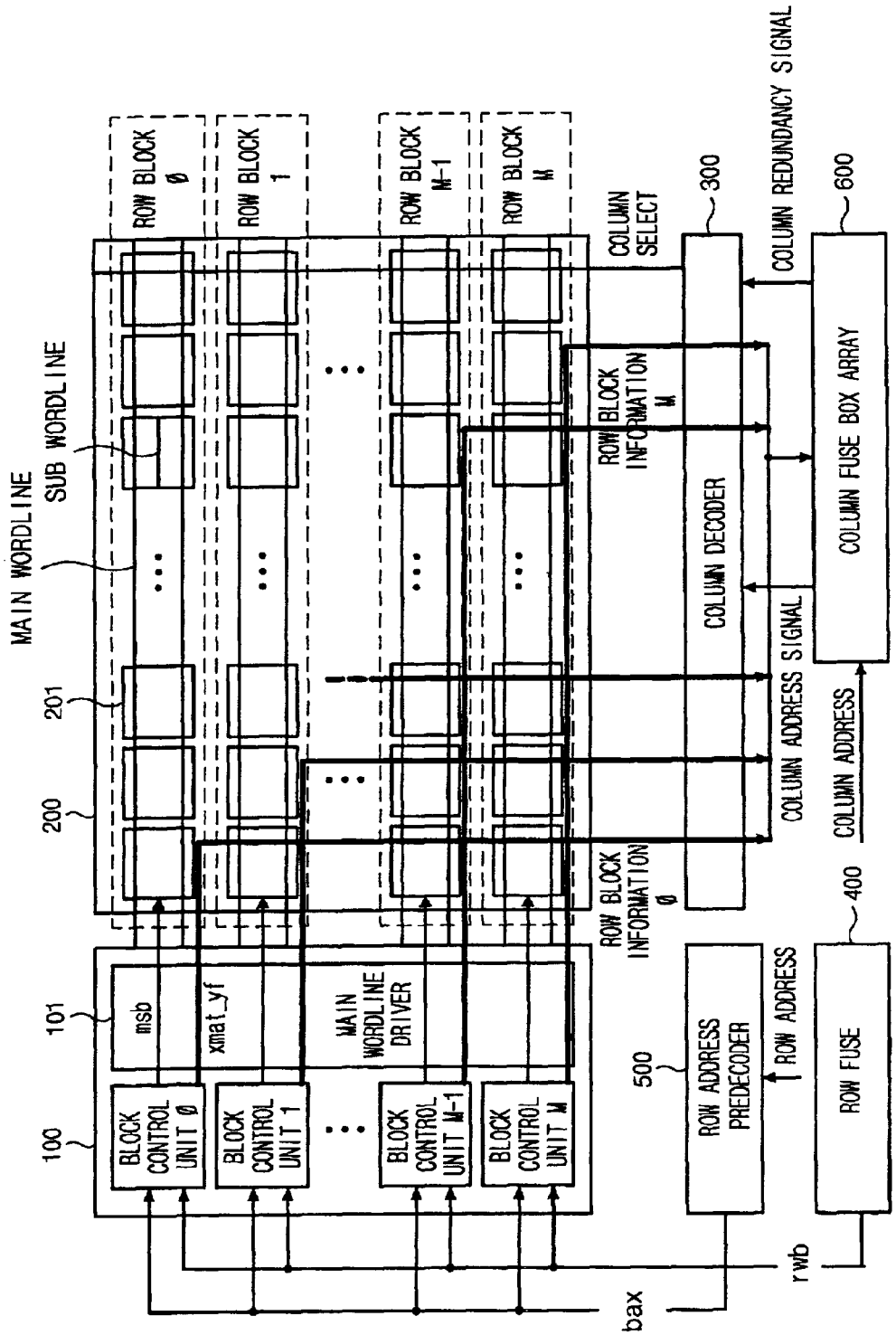
FIG. 7 illustrates another device constructed in accordance with the teachings of the present invention.

In the row access information transfer device of FIG. 7, a row block signal is transmitted via a path in a horizontal direction through the sense amplifier array region and the intersecting region. Also the row block signal is transmitted via a path in a vertical direction through the sense amplifier array region and the unit memory cell array 201 region of next row block, so that the row block signal is outputted to the column fuse box array 600.

Figure 8:
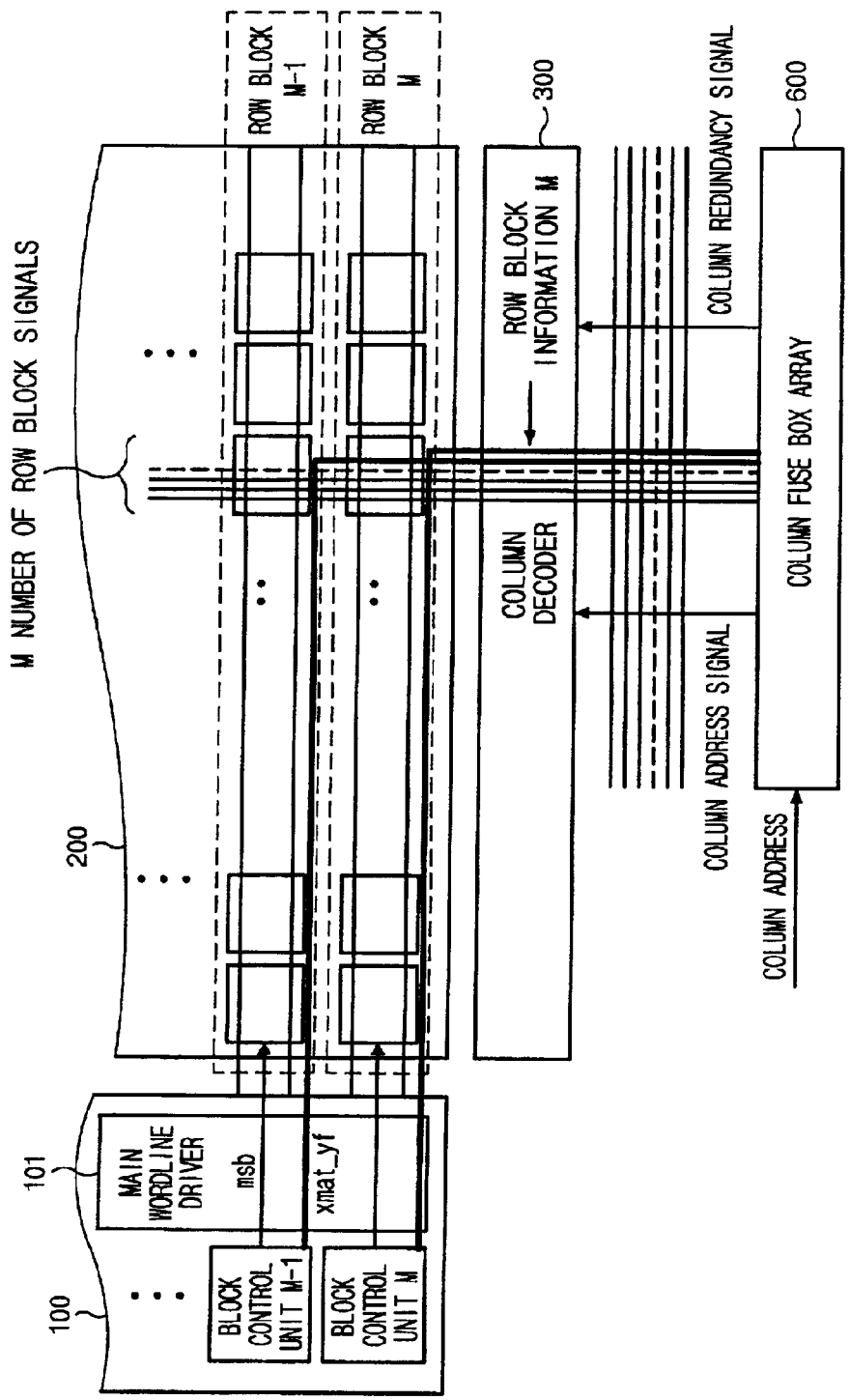
FIG. 8 illustrates another device constructed in accordance with the teachings of the present invention.

FIG. 8 illustrates a case wherein a transfer path of the M number of row block signals is concentrated on one unit memory cell array 201. FIG. 8 also shows a case wherein the whole or a part of a vertical direction path shares the same unit memory cell array 201 or the sub wordline driver array.

Figure 9:
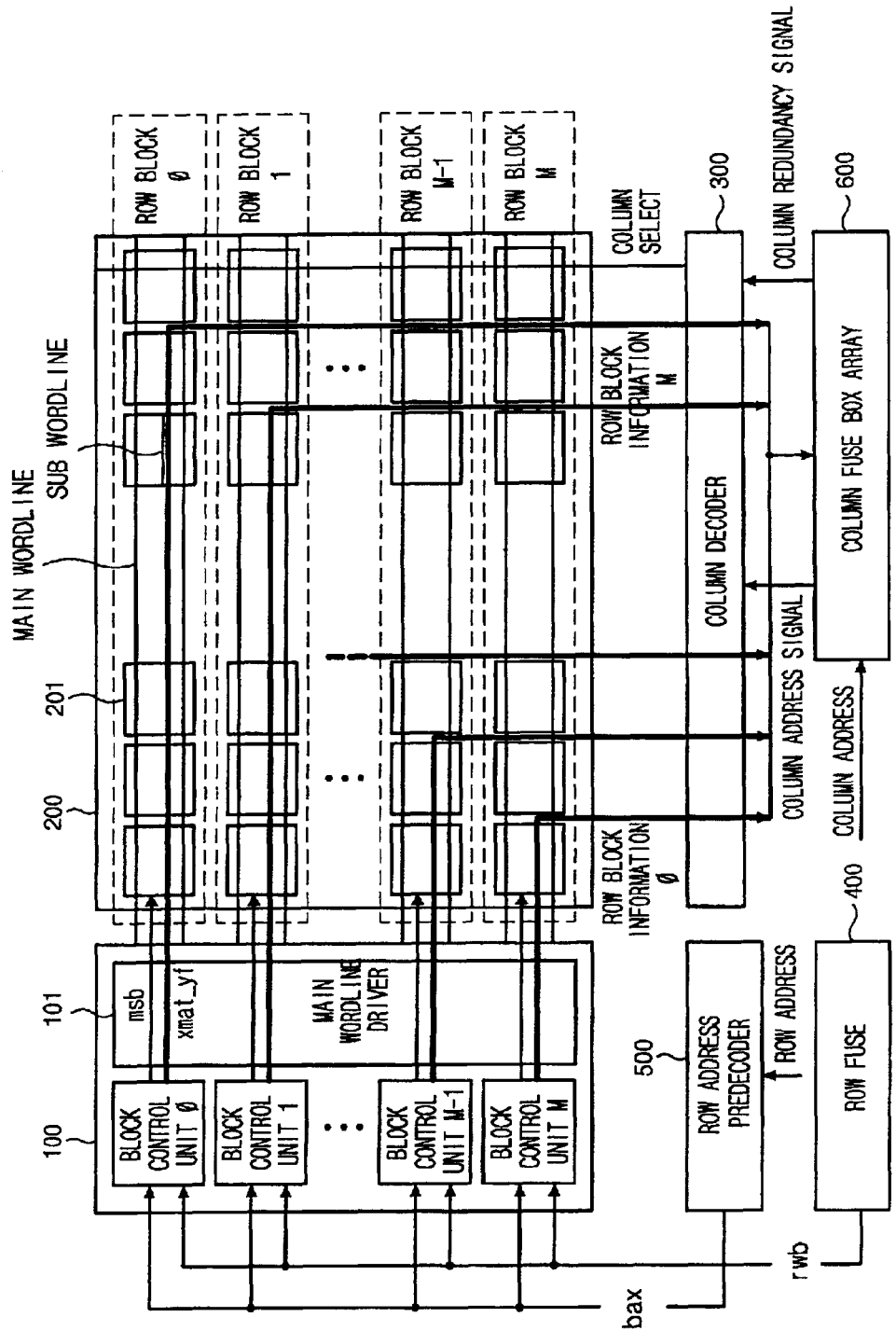
FIG. 9 illustrates another device constructed in accordance with the teachings of the present invention.

FIG. 9 illustrates a case wherein the row block information transfer paths do not overlap within the memory cell array 200, but they are instead concentrically connected to the column fuse box array 600. FIG. 9 also shows a case wherein the row block information transfer path and the memory cell array do not overlap at different unit memory cell array 201 region in respective paths.

As mentioned above, the disclosed devices distribute and transfer signals corresponding to a specific row block relating to an inputted row address to a column fuse box using a path within a cell array 200 when the row block is accessed. Therefore, the disclosed devices can increase the efficiency of a connection path compared to a conventional concentrated path and significantly improve a layout problem limited by the connection wiring.

From the foregoing, persons of ordinary skill in the art will appreciate that the disclosed methods and apparatus increase the wiring efficiency of a circuit by transferring a signal corresponding to a row block to a column fuse box using a path within a memory cell array without using an additional transfer line when a row block corresponding to an input row address is accessed.

Such persons will also appreciate that the disclosed methods and apparatus eliminate the conventional row block decoder, and reduce the layout area at a row/column intersecting region by generating a row block signal directly using the output of a row address predecoder and a row redundancy signal from a block control unit in a row control unit.

Further, the disclosed devices can reduce the layout area at a row/column intersecting region and increase the wiring efficiency with peripheral circuits, by directly receiving the output of a row address predecoder and a row redundancy signal from a block control unit in a row control unit to produce a row block signal.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A row access information transfer device comprising:
    a memory cell array;
    a row control unit for decoding a row address signal and a row redundancy signal and for outputting a block select signal selecting a corresponding row block and a row block signal including an information of block selection therein; and
    a column fuse box array for controlling a redundancy operation based on a column address and the row block signal,
    wherein the memory cell array comprises a path for transferring the row block signal from the row control unit to the column fuse box array therein.

2. A device as defined in claim 1, wherein the row control unit comprises a plurality of block control units, each of the block control units being structured to decode a predecoded row address received from a row address predecoder and the row redundancy signal received from a row fuse, and to output the row block select signal and the row block signal to a corresponding row block.

3. A device as defined in claim 2, wherein each of the block control units comprises:
    a decoding circuit for decoding the row address signal, the row redundancy signal, the predecoded row address and a wordline control signal;
    a delay circuit for delaying the output of the decoding circuit to produce the block select signal; and
    a row block signal generating circuit for producing the row block signal.

4. A device as defined in claim 1, wherein the path is at least partially located in at least one unit memory cell array within the memory cell array.

5. A device as defined in claim 4, wherein the path is at least partially located in a region between main wordlines and in a sub wordline driver array region.

6. A device as defined in claim 1, wherein the path is at least partially located in a sense amplifier array region and a sub wordline driver array region within the memory cell array.

7. A device as defined in claim 1, wherein the path is at least partially located in a unit memory cell array region and a sub wordline driver array region within the memory cell array.

8. A device as defined in claim 1, wherein the path is at least partially located in a sense amplifier array region and at least one unit memory cell array region within the memory cell array.

9. A device as defined in claim 1, wherein a vertical portion of the path is located in a unit memory cell array region such that a plurality of row block signal transfer paths are positioned at the same column within the memory cell array.

10. A device as defined in claim 1, wherein the path comprises a plurality of paths which do not overlap with one another.

11. A device as defined in claim 10 wherein the paths are located in different unit memory cell arrays and sub wordline driver arrays.

* * * * *

UNITED STATES PATENT AND TRADEMARK OFFICE
CERTIFICATE OF CORRECTION

PATENT NO.    : 6,771,555 B2
DATED         : August 3, 2004
INVENTOR(S)   : Sang Hee Kang Page 1 of 1

It is certified that error appears in the above-identified patent and that said Letters Patent is hereby corrected as shown below:

Column 6,
Line 10, please delete "row block select signal" and replace with
-- block select signal --.

Signed and Sealed this

Fourteenth Day of December, 2004

JON W. DUDAS
*Director of the United States Patent and Trademark Office*